United States Patent [19]

Ito et al.

[11] Patent Number: 5,073,514
[45] Date of Patent: Dec. 17, 1991

[54] METHOD OF MANUFACTURING MIS SEMICONDUCTOR DEVICE

[75] Inventors: Shinichi Ito; Naoya Noshi, both of Kanagawa; Yutaka Okamoto, Tokyo, all of Japan

[73] Assignee: Sony Corporation, Tokyo, Japan

[21] Appl. No.: 553,393

[22] Filed: Jul. 17, 1990

[30] Foreign Application Priority Data

Jul. 18, 1989 [JP] Japan .................................. 1-185759

[51] Int. Cl.$^5$ .................. H01L 21/265; H01L 21/336
[52] U.S. Cl. ........................................ 437/44; 437/29; 437/35; 437/41; 437/238; 357/23.3
[58] Field of Search ................. 437/29, 35, 41, 44, 437/235, 238; 357/23.3

[56] References Cited

U.S. PATENT DOCUMENTS

| | | | |
|---|---|---|---|
| 4,172,260 | 10/1979 | Okabe et al. | 357/23.3 |
| 4,258,465 | 3/1981 | Yasui et al. | 437/41 |
| 4,356,623 | 11/1982 | Hunter | 437/41 |
| 4,419,809 | 12/1983 | Riseman et al. | 437/44 |
| 4,488,351 | 12/1984 | Momose | 437/41 |
| 4,642,878 | 2/1987 | Maeda | 437/44 |
| 4,728,617 | 3/1988 | Woo et al. | 437/44 |
| 4,744,859 | 5/1988 | Hu et al. | 437/44 |
| 4,746,624 | 5/1988 | Cham et al. | 437/44 |
| 4,771,012 | 9/1988 | Yabu et al. | 437/35 |
| 4,818,714 | 4/1989 | Haskell | 156/643 |
| 4,921,812 | 5/1990 | Nagai | 437/35 |

FOREIGN PATENT DOCUMENTS

| | | | |
|---|---|---|---|
| 0050273 | 4/1979 | Japan | 437/35 |
| 0073975 | 5/1982 | Japan | 437/35 |
| 0093279 | 6/1983 | Japan | 437/35 |
| 0061185 | 4/1984 | Japan | 437/35 |
| 0119870 | 7/1984 | Japan . | |
| 0144175 | 8/1984 | Japan | 437/35 |
| 0231864 | 12/1984 | Japan . | |
| 0136376 | 7/1985 | Japan . | |
| 0241267 | 11/1985 | Japan . | |
| 0113474 | 5/1987 | Japan | 437/35 |
| 0041019 | 2/1988 | Japan | 437/35 |
| 0245921 | 10/1988 | Japan | 437/35 |
| 0021919 | 1/1989 | Japan | 437/35 |
| 0187923 | 7/1989 | Japan | 437/35 |

OTHER PUBLICATIONS

Tsang et al., "Fabrication of High Performance LDDFET's with Oxide Sidewall—Spacer Technology", IEEE Trans. on Electron Devices, vol. ED—29, No. 4, Apr. 1982, pp. 590–596.

Primary Examiner—Olik Chaudhuri
Assistant Examiner—M. Wilczewski
Attorney, Agent, or Firm—Hill, Van Santen, Steadman & Simpson

[57] ABSTRACT

This invention discloses a method of manufacturing a MIS semiconductor device having at least a portion of a drain region which contacts a channel and has a relatively low impurity concentration to obtain an LDD structure, wherein an insulating film is formed on at least a surface of a semiconductor substrate or double side walls are formed on a gate electrode, the surface is oxidized, and in this state, an impurity region having a relatively high impurity concentration is formed to manufacture a MIS semiconductor device having excellent characteristics at a high yield.

5 Claims, 5 Drawing Sheets

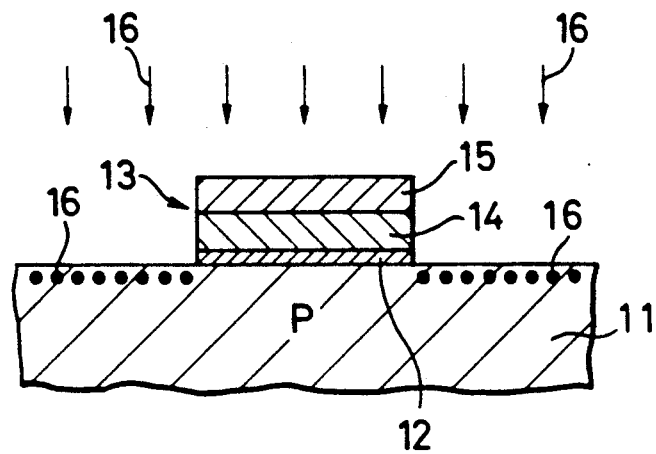
*FIG. IA*
PRIOR ART
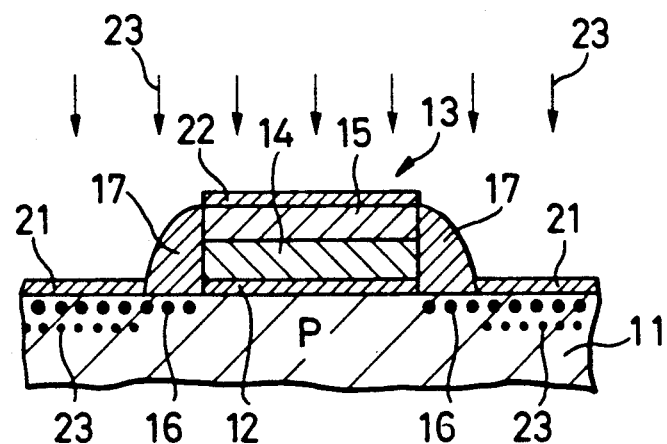
*FIG. IB*
PRIOR ART
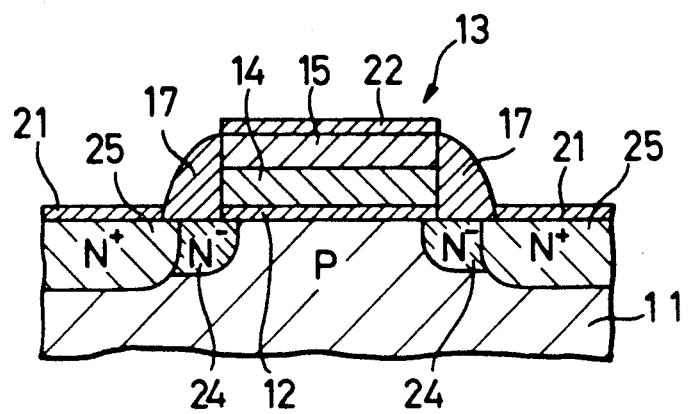
*FIG. IC*
PRIOR ART

METHOD OF MANUFACTURING MIS SEMICONDUCTOR DEVICE

BACKGROUND OF THE INVENTION

1. Field of the Invention

The present invention relates to a method of manufacturing a MIS semiconductor device having an LDD structure wherein at least a portion contacting a channel in a drain region has a relatively low impurity concentration.

2. Description of the Prior Art

A method of manufacturing a MIS semiconductor device having an LDD structure is described in "Monthly Semiconductor World" (1987, February) pp. 94-100 or the like. This method includes steps shown in FIG. 1.

In a prior art in FIG. 1, an $SiO_2$ film 12 serving as a gate insulating film is formed on an Si substrate 11, and a gate electrode 13 is formed on the $SiO_2$ film 12. The gate electrode 13 has a polycide structure constituted by a polycrystalline Si film 14 and a $WSi_x$ film 15.

Thereafter, phosphorus ions 16 for forming an $n^-$-type region for a source/drain region are implanted in the Si substrate 11 using the gate electrode 13 as a mask.

As shown in FIG. 1B, an $SiO_2$ film 17 is deposited by atmospheric-pressure, low-temperature (about 410° C.) CVD using monosilane or the like. The $SiO_2$ film 17 is etched by RIE to form side walls of the gate electrode 13 using the $SiO_2$ film 17.

Thermal oxidation is performed for the resultant structure to respectively form $SiO_2$ films 21 and 22 on the surfaces of the Si substrate 11 and the $WSi_x$ film 15. Note that the $SiO_2$ film 21 is used for preventing a decrease in gate breakdown voltage at the edge of the gate electrode 13.

Thereafter, arsenic ions 23 for forming an $n^-$-type region for a source/drain region are implanted in the Si substrate 11 using the gate electrode 13 and the $SiO_2$ film 17 as masks.

As shown in FIG. 1C, annealing is performed to the resultant structure to form $n^-$-type regions 24 and $n^+$-type regions 25 serving as source/drain regions.

The thermal oxidation for forming the $SiO_2$ films 21 and 22 is performed at a temperature within the range of 850° C. to 900° C. In a MIS transistor having a gate length of about 0.8 $\mu$m, however, when the high-temperature thermal oxidation is performed for a long time, a junction depth is undesirably increased. Therefore, since the thermal oxidation cannot be sufficiently performed, each of the $SiO_2$ films 21 and 22 has a thickness of about 100 Å.

When the $SiO_2$ film 21 has such a small thickness, the Si substrate 11 is greatly damaged during ion implantation of the arsenic 23. Therefore, crystal defects easily occur in the Si substrate 11. For this reason, degradation in device characteristics such as an increase in leak current through a junction occurs, and a production yield is decreased.

In addition, since RIE for forming the $SiO_2$ films 17 serving as the side walls of the gate electrode 13 causes a damage to the surfaces of the Si substrate 11 and the $WSi_x$ film 15, the $SiO_2$ films 21 and 22 are difficult to grow. For this reason, the thickness of the $SiO_2$ film 21 is small and, the above problem results in the easy formation of crystal defects in the Si substrate 11 which typically occurs.

Therefore, according to the prior art shown in FIG. 1, a MIS semiconductor device having excellent characteristics cannot be manufactured with a high yield.

OBJECT AND SUMMARY OF THE INVENTION

It is an object of the present invention to provide a method of manufacturing a MIS semiconductor device having excellent characteristics and high yield so as to almost prevent a semiconductor substrate from having crystal defects and prevent crystal defects, if any, from extending below a gate electrode, and to prevent a decrease in gate breakdown voltage.

According to the present invention, after an insulating film is formed on at least the surface of a semiconductor substrate, the surface is oxidized. Therefore, upon formation of a second impurity region having a relatively high impurity concentration in the semiconductor substrate, the semiconductor substrate is slightly damaged even if an oxide film is thin, and crystal defects can hardly be formed in the semiconductor substrate.

Since the oxide film is formed in addition to the insulating film, a decrease in gate breakdown voltage a the edge portion of a gate electrode can be prevented.

The second impurity region is formed while a first side wall of the gate electrode is covered by a second side wall, and then the second side wall is removed. Therefore, an offset is present between a region where an impurity for forming the second impurity region is implanted and crystal defects occur and the first side wall. For this reason, it is difficult for to act on the region where the crystal defects occur from the first side wall, and the crystal defects can be substantially prevented from extending below the gate electrode.

BRIEF DESCRIPTION OF THE DRAWINGS

FIGS. 1A to 1C are sectional side views showing the steps in manufacturing a MIS semiconductor device according to a conventional method;

DETAILED DESCRIPTION OF THE PREFERRED EMBODIMENTS

The first to sixth embodiments of the present invention will be described below with reference to FIGS. 2A to 2D to FIGS. 5A to 5C.

Figure 2A:
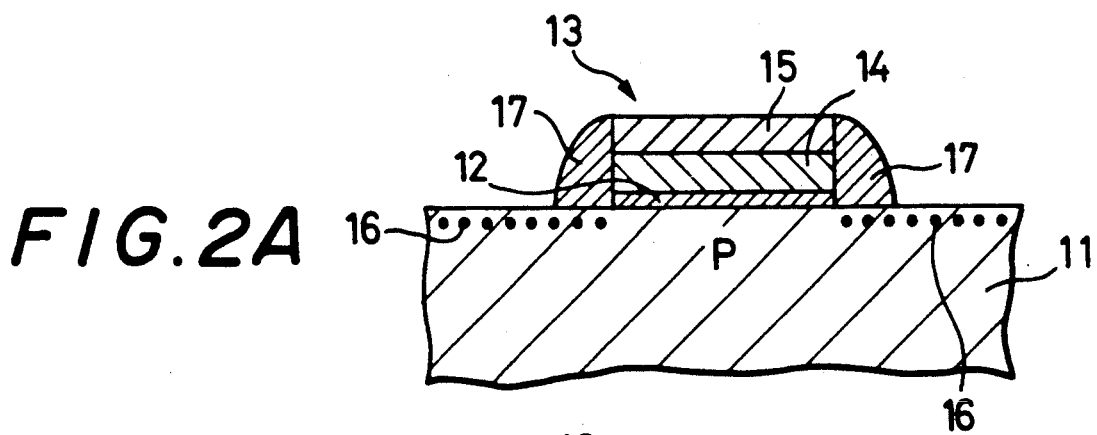
FIGS. 2A to 2D are sectional side views showing the steps in manufacturing a MIS semiconductor device according to the first embodiment of the present invention.

FIGS. 2A to 2D show the first embodiment. In the first embodiment, as shown in FIG. 2A, an $SiO_2$ film 12, a polycrystalline Si film 14 and a $WSi_x$ film 15 are formed on an Si substrate 11, and phosphorus ions 16 are implanted in the Si substrate 11. The same procedures as in the prior art shown in FIGS. 1A to 1C are executed until an $SiO_2$ film 17 is formed on the Si substrate 11.

Figure 2B:
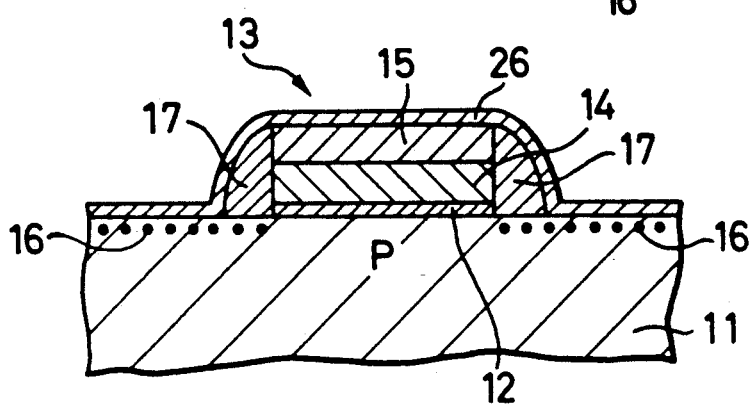

In the first embodiment, as shown in FIG. 2B, an $SiO_2$ film 26 having a thickness of 100 to 300 Å is deposited on the surfaces of the Si substrate 11 and $WSi_x$ film 15 or the like by low-pressure, high-temperature (about 700° C.) CVD using TEOS (tetraethylorthosilicate) or the like.

With the low-pressure, high-temperature CVD using TEOS or the like, a deposition rate can be decreased. Therefore, the $SiO_2$ film 26 having a small thickness can be deposited with good controllability.

Figure 2C:
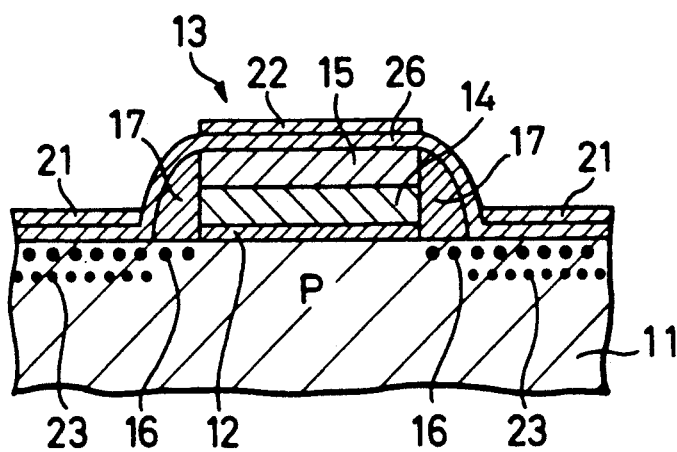
Figure 2D:
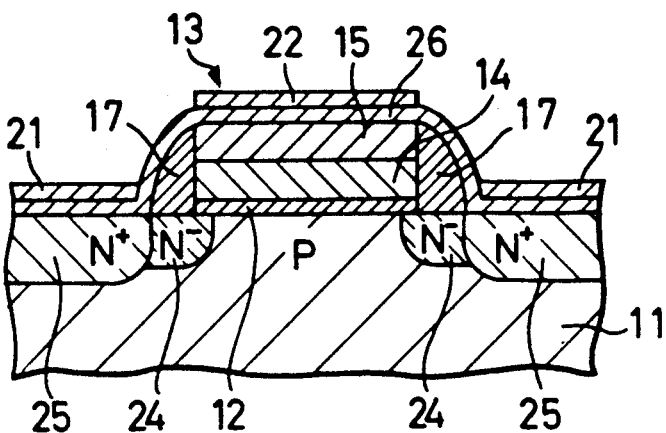

The same procedures as in the prior art shown in FIGS. 1A to 1C are executed. That is, as shown in FIG. 2C, $SiO_2$ film 21 and 22 are formed, and arsenic ions 23 are implanted. As shown in FIG. 2D, an $n^-$-type region 24 and an $n^+$-type region 25 are formed by annealing.

In the first embodiment as described above, since the $SiO_2$ films 26 are formed in addition to the $SiO_2$ film 21, even if the $SiO_2$ film 21 has a small thickness of about 100 Å like the prior art shown in FIGS. 1A to 1D, the Si substrate 11 is slightly damaged during implantation of the arsenic ions 23.

Therefore, crystal defects are difficult to occur in the Si substrate 11. According to the first embodiment, a MIS semiconductor device having excellent characteristics can be manufactured at a high yield.

The $WSi_x$ film 15 in an amorphous state is crystallized by heat generated during formation of the $SiO_2$ films 21 and 22, and the protection capability of the $WSi_x$ film 15 against ion implantation is degraded.

Therefore, when only the $SiO_2$ film 22 having the thickness of about 100 Å is formed on the surface of the $WSi_x$ film 15 like the prior art shown in FIG. 1B or 1C, the arsenic ions 23 easily reach a channel portion through the gate electrode 13 during implantation of the arsenic ions 23.

However, according to the first embodiment, in addition to the $SiO_2$ film 22, the $SiO_2$ film 26 is formed on the $WSi_x$ film 14. Therefore, the arsenic ions 23 cannot reach the channel portion through the gate electrode 13.

Note that since the temperature of the low-pressure, high-temperature CVD for forming the $SiO_2$ film 26 is lower than that of thermal oxidation, a junction depth is not increased even when the $SiO_2$ film 26 is formed.

The second embodiment will be described below. The second embodiment has substantially the same procedures as in the first embodiment except that $SiO_2$ films 17 serving as the side walls of a gate electrode 13 are formed by low-pressure, high-temperature CVD using TEOS or the like and an $SiO_2$ film 26 is formed by atmospheric-pressure, low-temperature CVD.

Figure 3:
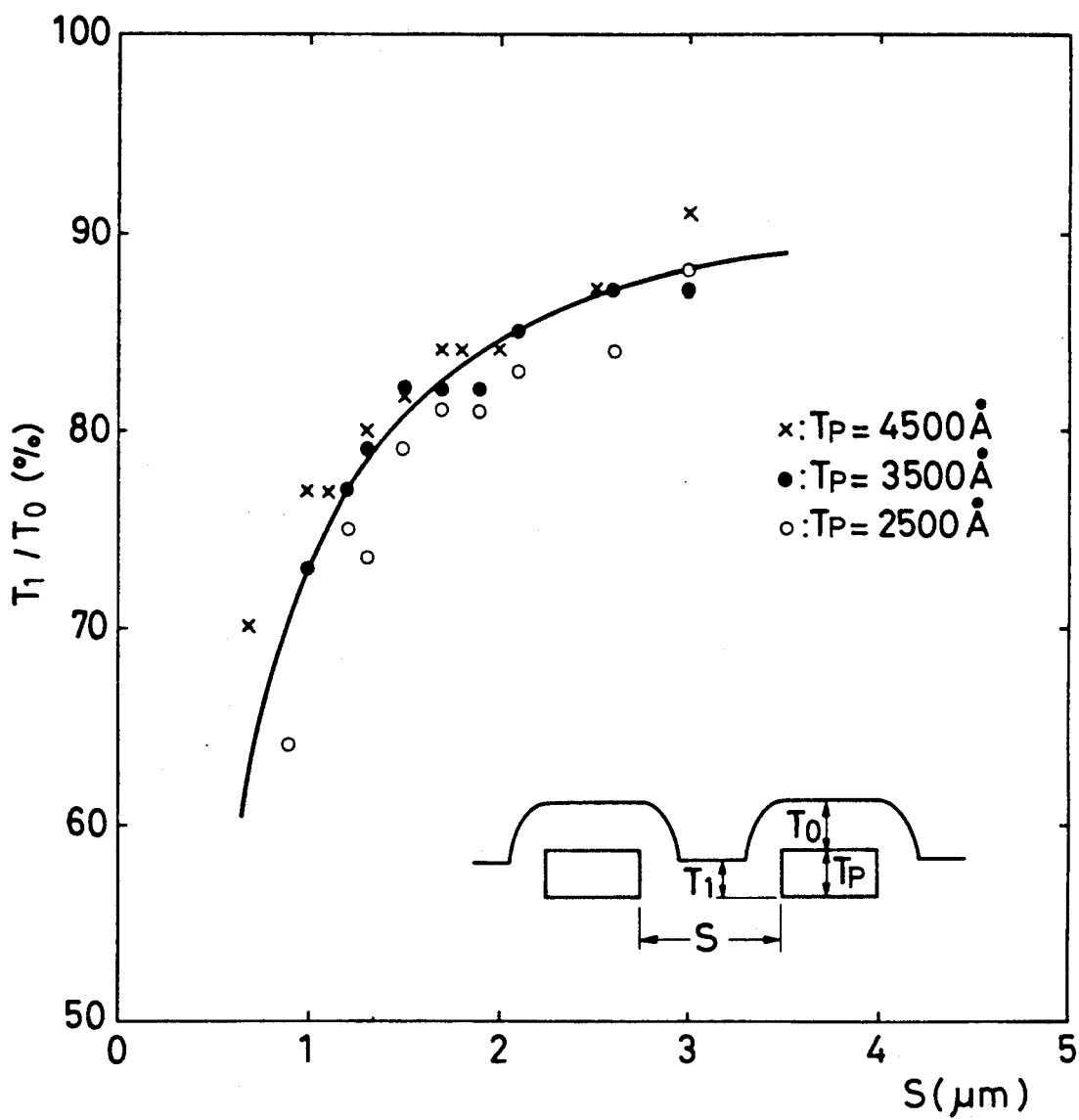
FIG. 3 is a graph showing step coverage in a MIS semiconductor device.

When the $SiO_2$ films 17 are formed by atmospheric-pressure, low-temperature CVD like the first embodiment, step coverage of the $SiO_2$ film 17 is good at a low-density pattern region such as a peripheral circuit portion but is poor at a high-density pattern region such as a memory cell. FIG. 3 shows the step coverage of the $SiO_2$ film 17.

Therefore, when RIE is performed for the $SiO_2$ film 17, portions of the $SiO_2$ film 17 except for the side walls of the gate electrode 13 on the surface of the Si substrate 11 are removed from the memory cell due to poor step coverage. At this time, the $SiO_2$ film 17 is left on the peripheral circuit portion.

If the RIE is stopped at this time, and then the arsenic ions 23 are implanted, the arsenic ions 23 do not deeply reach the Si substrate 11 at the peripheral circuit portion. Therefore, an impurity diffusion layer has a high sheet resistance.

In order to avoid this, the RIE must be performed until the $SiO_2$ film 17 is removed from the surface of the Si substrate 11 except for the side walls of the gate electrode 13 even in the peripheral circuit portion. However, in this case, the memory cell is excessively over-etched.

When over-etching excessively occurs, the Si substrate 11 is frequently damaged. Therefore, crystal defects easily occur in the Si substrate 11 to cause inferiority of the memory cell.

Contrast to this, according to the second embodiment, since the $SiO_2$ film 17 is formed by low-pressure, high-temperature CVD using TEOS or the like, the $SiO_2$ film 17 has good step coverage even in a high-density pattern region.

According to the second embodiment, a MIS semiconductor device having more excellent characteristics than those of the first embodiment can be manufactured at a higher yield than the first embodiment.

Note that, when both the $SiO_2$ films 17 and 26 are formed by low-pressure, high-temperature CVD, the $WSi_x$ film 15 is heated twice at a high temperature of 600° C. or more while the $WSi_x$ film 15 is exposed, thereby easily peeling the $WSi_x$ film 15 from a polycrystalline Si film 14.

In the second embodiment, however, since the $SiO_2$ film 26 is formed by atmospheric-pressure, low-temperature CVD, the $WSi_x$ film 15 is not peeled from the polycrystalline Si film 14.

The third embodiment will be described below. A semiconductor device in the third embodiment is manufactured following substantially the same procedures as in the second embodiment except that, when an $SiO_2$ film 17 is not left on the surface of an Si substrate 11 in a high-density pattern region such as a memory cell except for the side walls of a gate electrode 13, RIE applied to the $SiO_2$ film 17 is stopped and the $SiO_2$ film 17 remaining in a low-density pattern region such as a peripheral circuit portion at this time is removed by post wet etching.

A stop time of the RIE applied to the memory cell or the like can be detected using an end point detector for etching.

When wet etching is performed as in the third embodiment, the Si substrate 11 is not damaged. In addition, since the etching amount is about several hundreds Å, the shapes of the $SiO_2$ films 17 of the side walls of the gate electrode 13 are almost not affected.

Therefore, according to the third embodiment, a MIS semiconductor device having more excellent characteristics than those of the second embodiment can be manufactured at a yield higher than the second embodiment.

When the $SiO_2$ film 17 is formed by atmospheric-pressure, low-temperature CVD instead of low-pressure, high-temperature CVD using TEOS or the like as in the third embodiment, cavities are undesirably formed in the shoulder portions of the $SiO_2$ film 17.

The fourth embodiment will be described below. In the fourth embodiment, a memory device having a memory cell in which each interval between gate electrodes 13 falls within the range of 1.4 to 3.6 μm and a peripheral circuit portion in which each interval between gate electrodes 13 is more than 3.6 μm is manufactured.

In the fourth embodiment, an $SiO_2$ film 17 is deposited by atmospheric-pressure, low-temperature CVD using monosilane or the like, and RIE applied to the $SiO_2$ film 17 is temporarily stopped when the $SiO_2$ film 17 is absent in a 3.6-μm interval between the gate electrodes 13 on the surface of an Si substrate 11 except for the side walls of the gate electrode 13.

Thereafter, the memory cell is masked by a resist film. In order to remove a portion of the $SiO_2$ film 17 from the surface of the Si substrate 11, which corresponds to a peripheral circuit portion and excludes portions left on side walls of the gate electrodes 13, the RIE is started again.

When the interval between the gate electrodes 13 falls within the range of 1.4 to 3.6 μm, as is apparent from FIG. 3, step coverage falls within the range of 79 to 89%.

For this reason, when RIE is performed once until the $SiO_2$ film 17 on the peripheral circuit portion is removed while the memory cell is not masked by the resist film, as in the fourth embodiment, the memory cell is over-etched at a rate of 21 to 11%.

Contrast to this, according to the fourth embodiment, the first RIE is performed on the basis of a portion having an interval of 3.6 μm of the gate electrodes 13, and over-etching is performed at a maximum rate of 10%. For this reason, the Si substrate 11 is slightly damaged by the RIE, and it is difficult for crystal defects to occur in the Si substrate 11.

Therefore, according to the fourth embodiment, although the $SiO_2$ film 17 is deposited by atmospheric-pressure, low-temperature CVD using monosilane or the like, a MIS semiconductor device having excellent characteristics can be manufactured at a high yield.

Figure 4A:
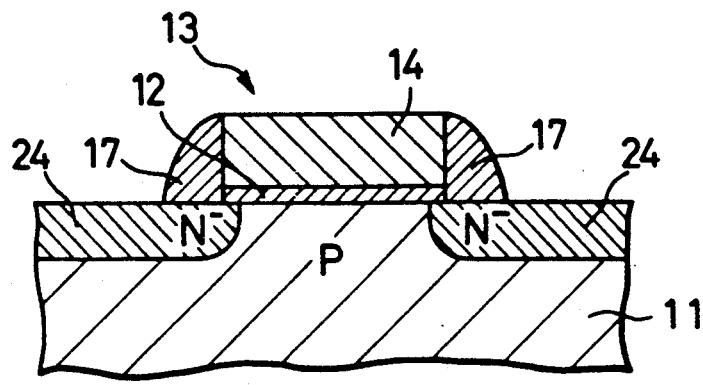
FIGS. 4A to 4D are sectional views showing the steps in manufacturing a MIS semiconductor device according to the fifth embodiment of the present invention.

FIGS. 4A to 4D show the fifth embodiment. In the fifth embodiment, as shown in FIG. 4A, an $SiO_2$ film 12 and a polycrystalline Si film 14 are formed on an Si substrate 11, and, for example, phosphorus ions are implanted in the Si substrate 11 using a gate electrode 13 as a mask to form $n^-$-type regions 24. In addition, $SiO_2$ films 17 are formed as side walls of the gate electrode 13 by CVD and the etch back process.

Figure 4B:
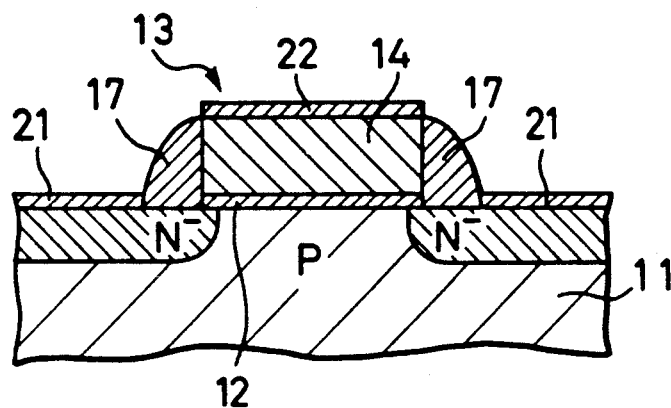
Figure 4C:
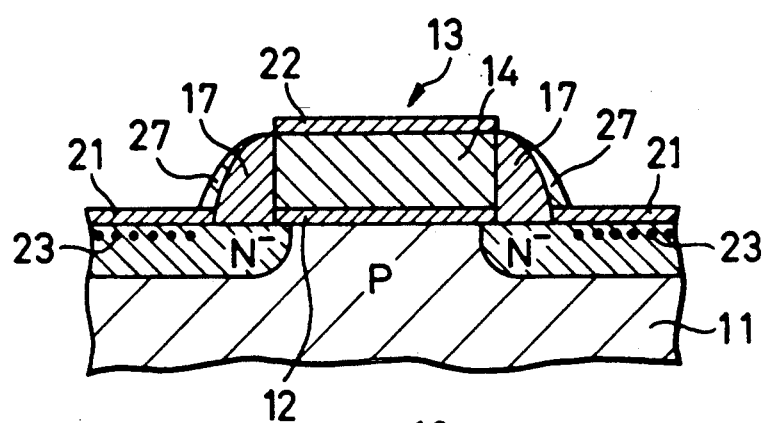

As shown in FIG. 4B, by thermal oxidation, $SiO_2$ film 21 is formed on the Si substrate 11, and an $SiO_2$ film 22 is formed on the polycrystalline Si film 14.

A polycrystalline Si film 27 having the thickness of about 1,000 Å is deposited on the resultant structure by CVD. The polycrystalline Si film 27 is full-face etched by RIE to form side walls of the polycrystalline Si film 27 outside the $SiO_2$ films 17.

Thereafter, arsenic ions 23 are implanted in the Si substrate 11 using the gate electrode 13, $SiO_2$ films 17 and the polycrystalline Si films 27 as masks. As is apparent from FIG. 4C, an offset corresponding to the thickness of the polycrystalline Si film 27 is present between the region of the Si substrate 11 in which the arsenic ions 23 are implanted and the $SiO_2$ films 17.

Figure 4D:
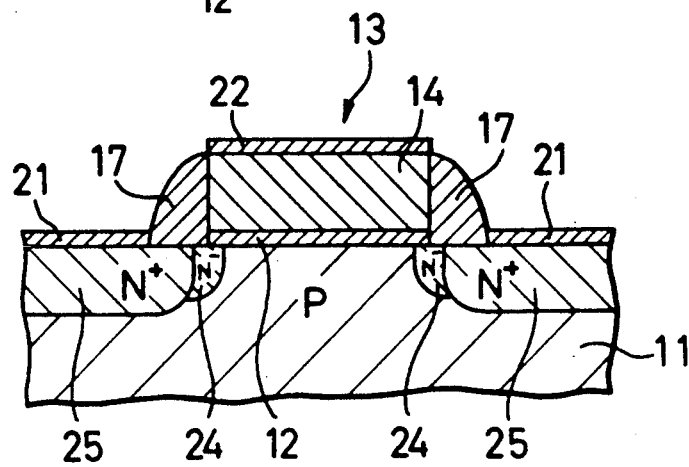

As shown in FIG. 4D, the polycrystalline Si films 27 are removed by plasma etching, and $n^+$-type regions 25 are formed by annealing.

When a amorphous region formed by implantation of the arsenic ions 23 is recrystallized, a temperature for recovering crystallinity depends on the orientation of the crystal. For this reason, crystal defects may be left to form a dislocation network. Any stress is easily concentrated on the edge portions of the $SiO_2$ films 17.

Therefore, a dislocation network is formed in the Si substrate 11 contacting edge portions of the $SiO_2$ films 17. When stress acts on the Si substrate 11 from the edge portions of the $SiO_2$ films 17 by annealing performed for forming the $n^+$-type regions 25, a dislocation is extended below the gate electrode 13. When the dislocation crosses a junction, the leakage current increases.

Contrast to this, according to the fifth embodiment, since the offset is present between the region of the Si substrate 11 in which the arsenic ions 23 are implanted and the $SiO_2$ films 17 as described above, it is difficult for stress to act on the $SiO_2$ films 17 in the region where the dislocation network is present.

Therefore, in the fifth embodiment, the dislocation can be prevented from extending below the gate electrode 13, and a high-quality MIS semiconductor device can be manufactured.

Note that, even if all the side walls of the gate electrode 13 are formed by the polycrystalline Si film 27, and if the side walls are removed after implantation of the arsenic ions 23, an offset can be provided between the gate electrode 13 and the ion-implanted region. However, electrode planarization by the side walls cannot be achieved.

Figure 5A:
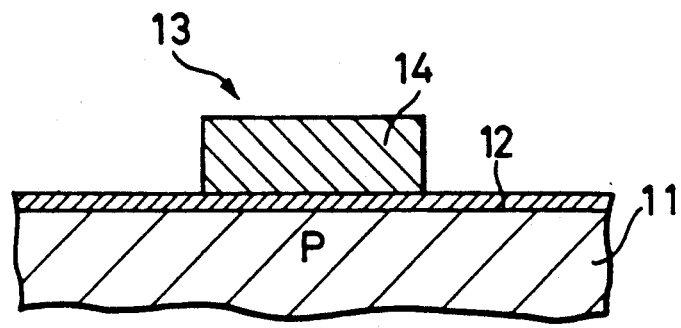
FIGS. 5A to 5C are sectional views showing the steps in manufacturing a MIS semiconductor device according to the sixth embodiment of the present invention.
Figure 5B:
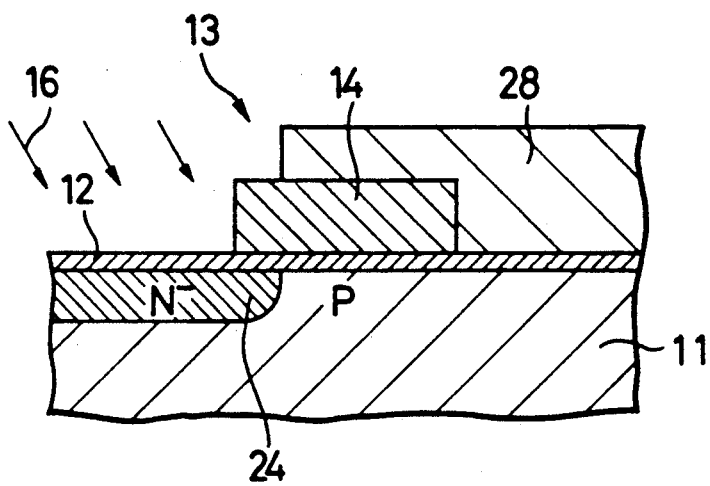
Figure 5C:
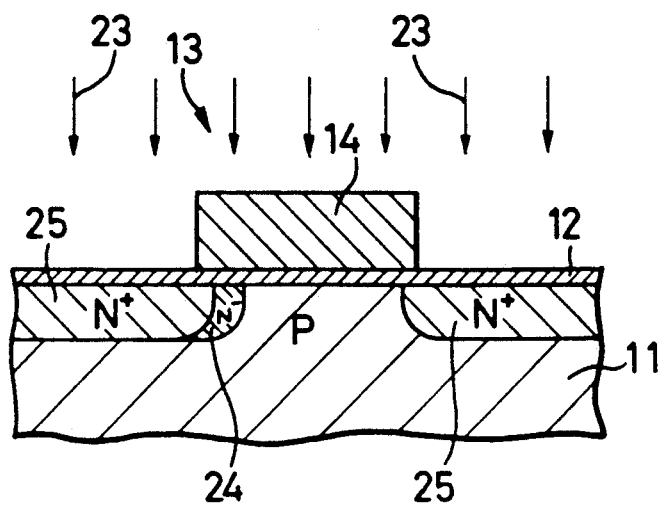

FIGS. 5A to 5C show the sixth embodiment. According to the sixth embodiment, an incidence angle of ions for forming an $n^-$-type region 24 and an incidence angle of ions for forming $n^+$-type regions 25 are different from each other, and a MIS transistor having an LDD structure can be manufactured without forming side walls of a gate electrode.

In the sixth embodiment, an $SiO_2$ film 12 and a polycrystalline Si film 14 are first formed on an Si substrate 11.

As shown in FIG. 5B, a resist film 28 is patterned to cover the source region of the MIS transistor. In this state, the Si substrate 11 is rotated, and phosphorus ions 16 are obliquely implanted in the Si substrate 11 using the resist film 28 and a gate electrode 13 as masks to form the $n^-$-type region 24.

As shown in FIG. 5C, the resist film 28 is removed, and arsenic ions 23 are vertically implanted in the Si substrate 11 using the gate electrode 13 as a mask to form the $n^+$-type regions 25.

In the sixth embodiment, since the $n^-$-type region 24 is formed in only a drain region, a MIS semiconductor device having a small short channel effect is manufactured.

What is claimed is:

1. A method of manufacturing a MIS semiconductor device, comprising the steps of: forming a gate electrode on a gate insulating film on a semiconductor substrate; forming a first impurity region having a relatively low impurity concentration in said semiconductor substrate using said gate electrode as a mask; forming side walls from a first $SiO_2$ layer on said gate electrode; forming an insulating film formed from a second $SiO_2$ layer on at least a surface of said semiconductor substrate, said side walls and said gate electrode; oxidizing at least said surface of said semiconductor substrate; forming a second impurity region having a relatively high impurity concentration in said semiconductor substrate using said gate electrode and said side walls as masks, and wherein a thickness of said insulating film falls within a range of 100 to 300 Å and wherein said insulating film is in place over the substrate surface, side walls and gate electrode during the step of forming the second impurity region.

2. A method of manufacturing a MIS semiconductor device, comprising the steps of: forming a gate electrode no a gate insulating film on a semiconductor substrate; forming a first impurity region having a relatively low impurity concentration in said semiconductor substrate using said gate electrode as a mask; forming side walls from a first $SiO_2$ layer on said gate electrode; forming an insulating film formed from a second SiO$_2$ layer on at least a surface of said semiconductor substrate, said side walls and said gate electrode; oxidizing at least said surface of said semiconductor substrate; forming a second impurity region having a relatively high impurity concentration in said semiconductor substrate using said gate electrode and said side walls as masks, wherein a thickness of said insulating film falls within a range of 100 to 300 Å and wherein said side walls are formed by a first SiO$_2$ film deposited by atmospheric-pressure, low-temperature CVD using monosilane to cover the surface of said semiconductor substrate and a surface of said gate electrode, and a second SiO$_2$ film deposited by low-pressure, high temperature CVD using tetraethylorthosilicate is used as said insulating film and wherein said insulating film is in place over the substrate surface, side walls and gate electrode during the step of forming the second impurity region.

3. A method according to claim 2, wherein said deposited first SiO$_2$ film is removed by reactive ion etching to expose at least a portion of said semiconductor substrate,
   a coating layer is formed on a region where said semiconductor substrate is exposed, and
   said first SiO$_2$ film is further removed by reactive ion etching using said coating layers as a mask to form said side walls.

4. A method of manufacturing a MIS semiconductor device, comprising the steps of: forming a gate electrode no a gate insulating film on a semiconductor substrate; forming a first impurity region having a relatively low impurity concentration in said semiconductor substrate using said gate electrode as a mask; forming side walls from a first SiO$_2$ layer on said gate electrode; forming an insulating film formed from a second SiO$_2$ layer on at least a surface of said semiconductor substrate, said side walls and said gate electrode; oxidizing at least said surface of said semiconductor substrate; forming a second impurity region having a relatively high impurity concentration in said semiconductor substrate using said gate electrode and said side walls as masks, wherein a thickness of said insulating film walls within a range of 100 to 300 Å, wherein said side walls are formed by a first SiO$_2$ film deposited by low-pressure, high-temperature CVD using tetraethylorthosilicate to cover a surface of said gate electrode and the surface of said semiconductor substrate; and a second SiO$_2$ film deposited by atmospheric-pressure, low-temperature CVD using monosilane is used as said insulating film, and wherein said insulating film is in place over the substrate surface, side walls and gate electrode during the step of forming the second impurity region.

5. A method according to claim 4, wherein said deposited first SiO$_2$ film is removed by reactive ion etching to expose at least a portion of said semiconductor substrate, and
   said first SiO$_2$ film is further removed by wet etching to form said side walls.

* * * * *